United States Patent [19]

Schmitz

[11] Patent Number: 4,864,155
[45] Date of Patent: Sep. 5, 1989

[54] CIRCUITRY FOR SUPPRESSING AUDIBLE NOISE

[75] Inventor: Friedrich Schmitz, Villingen-Schwenningen, Fed. Rep. of Germany

[73] Assignee: Detusche Thomson-Brandt GmbH, Villingen, Fed. Rep. of Germany

[21] Appl. No.: 235,651

[22] Filed: Aug. 24, 1988

[30] Foreign Application Priority Data

Sep. 4, 1987 [DE] Fed. Rep. of Germany ....... 3729656

[51] Int. Cl.$^4$ .............................................. H03G 3/26
[52] U.S. Cl. .................................... 307/112; 307/353; 307/540; 307/542; 307/125; 330/51; 330/86; 330/254; 360/60; 360/61
[58] Field of Search ............... 307/112, 125, 129, 130, 307/141, 243, 253, 254, 350, 353, 549, 540, 542, 550; 330/51, 86, 124 R, 149, 207 P, 252, 254, 255, 258, 265, 267, 279, 298; 333/81 R; 455/158, 177, 179, 183, 186, 192, 194, 212, 214, 218, 219, 222, 223, 234; 358/165, 343; 360/60, 61, 62, 67, 32, 105, 106, 130.21

[56] References Cited

U.S. PATENT DOCUMENTS

| Re. 32,278 | 11/1986 | Yokota et al. | 307/141 X |
|---|---|---|---|
| 3,582,675 | 6/1971 | Jordan | 330/86 X |
| 3,867,709 | 2/1975 | Seki et al. | 330/265 |
| 3,921,091 | 11/1975 | Van Kessel et al. | 330/254 |
| 4,117,406 | 9/1978 | Takahashi et al. | 455/218 |
| 4,194,165 | 3/1980 | Skulski | 330/265 X |
| 4,218,662 | 8/1980 | Schroder | 307/542 X |
| 4,288,753 | 9/1981 | Babano | 330/51 |
| 4,390,847 | 6/1983 | Yamada et al. | 330/51 |
| 4,396,955 | 8/1983 | Kohtani et al. | 360/60 |
| 4,410,855 | 10/1983 | Underhill et al. | 307/353 X |
| 4,417,165 | 11/1983 | Fujibayashi | 307/540 |
| 4,428,008 | 1/1984 | Fawkes | 360/61 |
| 4,491,800 | 1/1985 | Miyata | 330/51 |
| 4,581,541 | 4/1986 | Nakayama et al. | 307/350 X |
| 4,585,956 | 4/1986 | Lie | 307/353 |

Primary Examiner—William M. Shoop, Jr.
Assistant Examiner—Paul Ip
Attorney, Agent, or Firm—Max Fogiel

[57] ABSTRACT

An arrangement for suppressing audible noise occurring when audio equipment is switched on and off, in which a first electronic switch is connected to the output of an amplifier that has a negative feedback loop formed between the amplifier output and an inverting input of the amplifier. The output of the amplifier is connected to a load impedance through the first electronic switch. A second electronic switch is connected to a junction between the load impedance and the first electronic switch, and to the inverting input of the amplifier. A joint control line permits the two electronic switches to be turned on and off simultaneously. The two electronic switches can be connected in parallel through a feedback resistor in the negative feedback loop.

4 Claims, 2 Drawing Sheets

CIRCUITRY FOR SUPPRESSING AUDIBLE NOISE

BACKGROUND OF THE INVENTION

The invention concerns circuitry for suppressing audible noise, especially noise that occurs when audio equipment is turned on and off.

What is called a mute circuit is usually built into such equipment to supress the noise, which is expressed for example in the form of an unpleasant rattling perceived when the equipment is turned on or off. Audible noise also occurs for example during switching from one receiving channel to another because the new tuning voltage, as it becomes established at a specific time constant, makes one transmitter after another perceptible in accordance with the range of tuning voltages being traversed. The mute circuit also suppresses interference that, in the capacity of intermediate-transmitter noise, occasions unpleasant audible noise.

Positioning a relay or electronic switch at the output terminal of the amplifier to either disconnect or short-circuit it is known. Using relays yields good technical results, but the components are very expensive, and the circuit will eventually no longer operate unobjectionably due to contamination of the relay contacts. Switching transistors, although cheaper, also have certain drawbacks. A decrease of 80 dB requires at least two transistors grounded by way of longitudinal resistors. Since the resistors are rated at at least 300Ω, the output resistance of the amplifier is disadvantageously increased to at least 500Ω. To keep the distortion factor low at output voltages of up to 2 V, the transistors must have a negative bias of 4 to 5 V, in which case higher output voltages cannot be attained. A mute decreased of more than 80 dB is impossible. Finally, powerful distortions occur during the switch from mute to playback operation.

Positioning two bipolar electronic switches each in series with the load resistor of an amplifier and in its negative-feedback loop is known. In this case the amplifier will have a specific amplification level of 40 dB for example both in its amplification and in its mute mode. The non-linearity of the electronic switch in series with the load impedance result in conjunction with its final resistor in non-linear distortion at the resistor that cannot be completely eliminated by the feedback. A very complicated control circuit (European Pat. No. 0 095 774) that is only technically feasible in integrated circuitry because it is not profitable at too discrete an expenditure is needed to activate the electronic switch.

SUMMARY OF THE INVENTION

The object of the invention is to provide a mute circuit that is very cost-effective, allows an essentially greater decrease, and operates without distortion. According to the present invention, a first electronic switch is connected to the output of an amplifier which has a negative feedback loop formed between the amplifier output and an inverting input of the amplifier. The amplifier output is also connected to a load impedance through the first electronic switch. A junction connection is provided between the load impedance and the first electronic switch. A second electronic switch is connected between the junction connection and the inverting input of the amplifier.

The invention will now be specified with reference to the drawing, wherein

DESCRIPTION OF THE PREFERRED EMBODIMENTS

Figure 1:
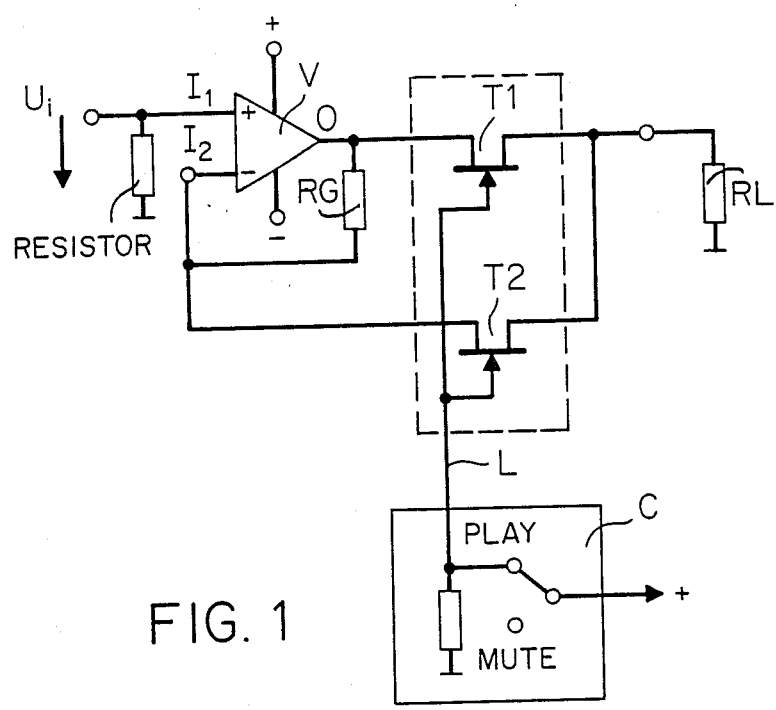
FIG. 1 is an electrical schematic diagram and illustrates one embodiment of the present invention.

The basic principle behind the invention is illustrated in FIG. 1. An input voltage Ui that is to be amplified is at the input terminal I1 of an amplifier V. An output terminal O is connected by way of a negative-feedback resistor RG to the inverting input terminal I2 of amplifier V. A load impedance RL is connected by way of an electronic switch T1 to the output terminal O of amplifier V. The contact of switch T1 that is connected to load impedance RL is connected by way of another electronic switch T2 to the inverting input terminal I2 of amplifier V. The two electronic switches T1 and T2 can be separate field-effect transistors FET or MOSFET or bipolar transistors or can be combined into an integrated analog switch of the type exemplified by Motorola integrated circuit 4066 for instance.

When the amplifier is in operation, a useful current flows to ground by way of switch (FET) T1 and load impedance RL, resulting in non-linear distortions in the drain-to-source section. The output terminal of switch T1 is connected into the feedback loop of amplifier V by way of switch (FET) T2. The distortion occasioned by the FET is compensated by amplifier V, which acts as an operational amplifier.

Due to the high input resistance of the inverting input terminal I2 of amplifier V, practically no current flows through switch (FET) T2, which accordingly supplies no distortion. Since the distortions in the drain-to-source section of switch T1 are completely compensated, the output resistance is, in the capacity of a source resistance for load impedance RL, practically 0Ω.

In the mute mode, activation of a simple control circuit C, in the form of a changeover switch for example, simultaneously blocks both switches T1 and T2 by means of an appropriate potential on a control line L. The negative-feedback loop is now closed by way of negative-feedback resistor RG, and with it the direct-current path from the output terminal to the inverting input terminal. Since switches T1 and T2 accordingly become highly ohmic, the attenuation becomes very powerful, attaining 100 dB in the mid-frequency range. The maximal output voltage of amplifier V is dictated by the operating parameters of the field-effect transistors. The self-blocking action of the field-effect transistors, meaning that they become highly ohmic without operating voltage, results in advantages, especially when the amplifier is turned on, because the output terminal of the circuit is separated very ohmically from the turn-on pulses of an upstream circuit.

Figure 2:
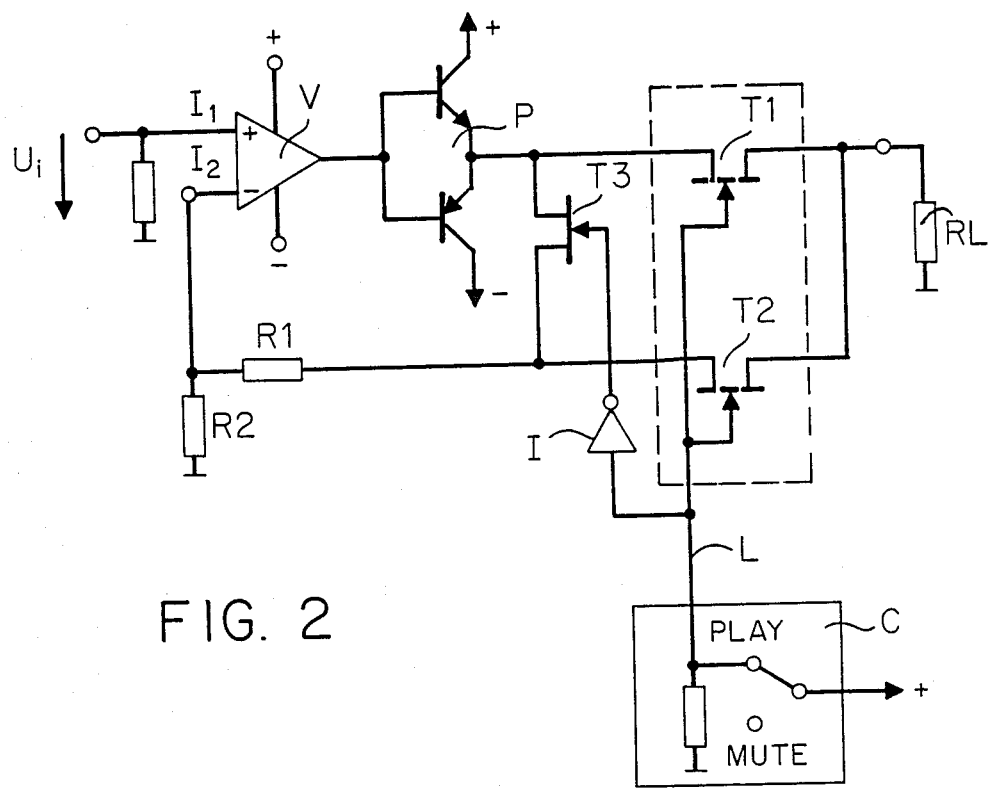
FIG. 2 is an electrical schematic diagram and illustrates another embodiment.

FIG. 2 illustrates another embodiment of circuitry, with similar components being labeled with the same reference numbers.

There is a power stage P downstream of amplifier V, which in this case has a voltage amplification $v_u$ of 26 dB for example, with the downstream power stage P having an amplification of 0 dB. The amplifier is feed-backed by way of resistors R1 and R2. To prevent the feedback loop from being disconnected in the mute mode, when switch T2 is blocked, that is, so that the amplifier would amplify high and force into the limit, another switch T3 is incorporated, being switched through by way of an inverter I by control circuit C. Switch T1 is a power field-effect transistor.

The advantage of the aforesaid circuits in relation to the initially described state of the art is that the mute mode requires no preliminary current or bias. This is important for example when the circuitry is activated and no supply voltages have had time to become established. Since the circuitry has only a low interior resistance, there is practically no distortion factor. The circuitry has a high voltage strength. Audible noise is completely eliminated as the mute circuit becomes active.

Figure 3:
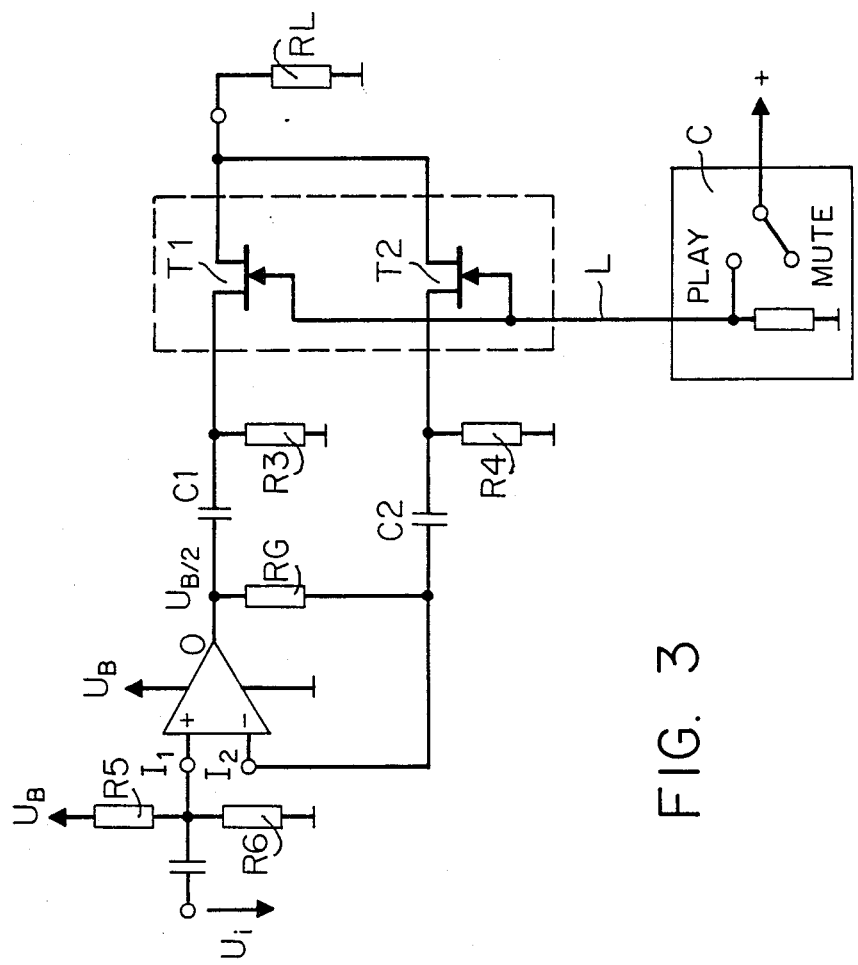
FIG. 3 is an electrical schematic diagram and illustrates still another version of the embodiment illustrated in FIG. 1.

FIG. 3 illustrates another version of the circuitry illustrated in FIG. 1. It features one capacitor C1 with a discharge resistor R3 at the output terminal of amplifier V and another capacitor C2 with a discharge resistor R4 in the negative feedback loop. This design makes it possible to operate amplifier V with a voltage that is related only to ground. A voltage divider consisting of two equivalent resistors R5 and R6 is positioned at input terminal I1.

What is claimed is:

1. An arrangement for suppressing audible noise occurring when audio equipment is switched on and off, comprising: an amplifier with output means; a first electronic switch connected to said output means of said amplifier; an amplifier load impedance connected to said amplifier output means through said first electronic switch: said amplifier having a negative feedback loop formed between said output means and an inverting input of said amplifier; junction connection means between said load impedance and said first electronic switch; and a second electronic switch connected between said junction connection means and said inverting input of said amplifier; a power-amplification stage connected to said output means of said amplifier; a voltage-amplification stage with an inverting input terminal; and a third electronic switch closing said negative-feedback loop from an output connection of said power-amplification stage to said inverting input terminal of said voltage-amplification stage when said first electronic switch and said second electronic switch are simultaneously blocked, said first electronic switch and said second electronic switch operating in a mute mode when being blocked simultaneously.

2. An arrangement as defined in claim 1, including a joint control line connected to said first electronic switch and said second electronic switch for turning said first electronic switch and said second electronic switch on and off simultaneously.

3. An arrangement as defined in claim 1, including a feedback resistor in said negative feedback loop, said first electronic switch and said second electronic switch being connected substantially in parallel through said feedback resistor.

4. An arrangement as defined in claim 1, wherein said amplifier has an amplificaton level of 0 DB when said amplifier is operating.

* * * * *